United States Patent [19]

Ogawa et al.

[11] Patent Number: 5,370,971
[45] Date of Patent: Dec. 6, 1994

[54] EPOXY BASED PHOTOPOLYMERIZABLE COMPOSITION

[75] Inventors: Tetsuo Ogawa, Hiratsuka; Kenji Seko, Yokosuka; Tetsu Maki, Odawara; Naozumi Iwasawa, Hiratsuka, all of Japan

[73] Assignee: Kansai Paint Co., Ltd., Hyogo, Japan

[21] Appl. No.: 968,313

[22] Filed: Oct. 29, 1992

[30] Foreign Application Priority Data

Nov. 1, 1991 [JP] Japan .................. 3-315406

[51] Int. Cl.$^5$ .................. G03C 1/725; C08G 59/18
[52] U.S. Cl. .................. 430/280; 430/281; 430/286; 430/287; 522/100; 522/148
[58] Field of Search .............. 522/100, 148; 430/280, 430/286, 281, 287

[56] References Cited

U.S. PATENT DOCUMENTS

| | | | |
|---|---|---|---|
| 4,486,504 | 12/1984 | Chung | 522/100 |
| 4,496,696 | 1/1985 | Kurita | 522/100 |
| 5,093,223 | 3/1993 | Iwasawa et al. | 522/103 |

*Primary Examiner*—John Kight, III
*Assistant Examiner*—John M. Cooney, Jr.
*Attorney, Agent, or Firm*—Wenderoth, Lind & Ponack

[57] ABSTRACT

A photopolymerizable composition comprising:
(a) an aromatic epoxy resin derivative containing, per kilogram of the resin, 0.3 to 10 mole equivalents of a polymerizable unsaturated group and 0.1 to 3 mole equivalents of a specific aprotic onium salt-containing group,
(b) a polysiloxane having a specific polysiloxane chain in a molecule, and containing 0.01 to 5 mole equivalents, per kilogram of the polysiloxane, of the aprotic onium salt-containing group, and
(c) a photopolymerization initiator.

Said photopolymerizable composition can form a resist film excellent in adhesion to a substrate, heat resistance, chemical resistance, impact resistance and solder plating property, and is suitable as a solder resist in particular.

19 Claims, No Drawings

EPOXY BASED PHOTOPOLYMERIZABLE COMPOSITION

BACKGROUND OF THE INVENTION

1. Field of the Invention

This invention relates to a photopolymerizable composition, and more specifically to a photopolymerizable composition suitable as a solder resist for producing a printed circuit board. Further, this invention relates to a method for forming a cured coated film using the above photopolymerizable composition.

2. Prior Art

In order to avoid deposition of a solder on areas other than the required area in soldering parts to a printed circuit board, etc., a solder resist has been applied so far for protecting the circuit on the surface of the printed circuit board.

The solder resist has been applied, in many cases, by printing the resist composition on a substrate by a silk screen printing method, or the like in accordance with a required pattern, and then heat-curing the composition or curing it by actinic radiation such as ultraviolet light. However, with a trend toward higher density of the printed circuit board owing to smaller size or higher accuracy of electric and electronic parts, a liquid phototype composition with higher patterning accuracy has been proposed.

For example, it has been proposed that a film with a necessary pattern drawn thereon is adhered to a resist film obtained by coating a liquid photopolymerizable solder resist on a printed circuit board by silk screen printing, roll coater coating or the like and drying it to touch by heating, etc. and is irradiated with actinic radiation such as ultraviolet light or the like to cure exposed areas. The unexposed portion is dissolved and removed with a developer to form a solder plating pattern and a circuit protective film (U.S. Pat. No. 4,786,579).

With a fine circuit pattern, not only improved solder heat resistance and chemical resistance but also excellent impact resistance has been lately required of the solder resist. To meet this requirement, we have made various investigations over modification of the known liquid resist resin with organopolysiloxane by blending or chemical bonding.

When using, however, the thus modified resin as a liquid resist, storage stability decreases owing to phase separation in case of the blending, and workability decreases by increase in viscosity because the molecular weight of the product is difficult to control in case of the chemical bonding. Further, the use of polysiloxane enhances the hydrophobic nature of the resin, decreasing developability.

Still further, the conventional resist uses an organic solvent or a dilute alkali aqueous solution as a developer. The use of the organic solvent as the developer poses risks of fire hazards, toxicity to human beings and other safety or sanitation problems. Meanwhile, a resist using a dilute alkali aqueous solution as a developer is inferior in performance to a heat curing-type or organic solvent developing-type resist.

In order to eliminate the defects of the conventional resist, the present inventors have made assiduous studies to obtain a photopolymerizable composition which can form a resist film excellent in adhesion to a substrate, heat resistance, chemical resistance, impact resistance and solder plating property and also use a liquid free from safety or sanitation problems as a developer.

As a result, a photopolymerizable composition has been found which allows formation of a resist film having the aforesaid intended performance on a substrate such as a printed circuit board or the like, which can use a dilute acid aqueous solution or water that ensures high safety, as a developer and which is good in storage stability. This finding has led to completion of this invention.

SUMMARY OF THE INVENTION

This invention provides a photopolymerizable composition comprising (a) an aromatic epoxy resin derivative containing, per kilogram of the resin derivative, 0.3 to 10 mole equivalents of a polymerizable unsaturated group, and 0.1 to 3 mole equivalents of an aprotic onium salt-containing group of the formula

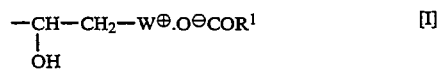

[I]

wherein $R^1$ denotes a hydrogen atom or a hydrocarbon group having 1 to 29 carbon atoms which may be substituted with a hydroxyl, alkoxy or ester group or a halogen atom; and

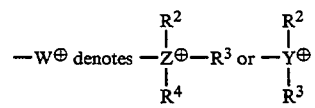

in which Z denotes a nitrogen or phosphorus atom, Y denotes a sulfur atom, $R^2$, $R^3$ and $R^4$ are the same or different and each denotes an organic group having 1 to 14 carbon atoms, or $R^2$ and $R^3$ or $R^2$, $R^3$ and $R^4$ may jointly form a heterocyclic group when taken together with the adjacent nitrogen, phosphorus or sulfur atom, (b) a polysiloxane having a polysiloxane chain of the formula

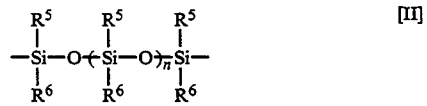

[II]

wherein $R^5$ and $R^6$ are the same or different and each denotes a hydrocarbon group having 1 to 30 carbon atoms which may be substituted with an alkoxy or ester group or a halogen atom, and n is an integer of 1 to 200, and containing 0.01 to 5 mole equivalents, per kilogram of the polysiloxane, of the aprotic onium salt-containing group of formula [I], and (c) a photopolymerization initiator.

Further, this invention provides a method for forming a cured coated film, which comprises (A) a step of coating the photopolymerizable composition on a substrate to form an uncured coated film, and (B) a step of irradiating the uncured coated film with actinic radiation to cure said coated film.

This invention will be described in moire detail below.

DETAILED DESCRIPTION OF THE INVENTION

Aromatic epoxy resin derivative [component (a)]

The aromatic epoxy resin derivative used as component (a) in the composition of this invention contains a polymerizable unsaturated group and the aprotic onium salt-containing group of formula [I] in a molecule as described in, for example, col. 2 line 58—col. 8 line 11 of U.S. Pat. No. 5,093,223 to Iwasawa, et al. Any aromatic epoxy resin containing a polymerizable unsaturated group and an aprotic onium salt-containing group of formula [I] will do. The molecular weight of the resin is not critical. Generally, however, the weight average molecular weight of the resin as determined by gel permeation chromatography (GPC) is preferably about 500 to about 20,000, more preferably about 700 to about 10,000, most preferably about 1,000 to about 5,000.

The aromatic epoxy resin derivative as component (a) can be obtained, for example, by introducing the polymerizable unsaturated group and the aprotic onium salt-containing group into the aromatic epoxy resin. The polymerizable unsaturated group may be introduced into the epoxy resin which serves as a cationic moiety of the onium salt or into the anionic moiety of the onium salt with an organocarboxylic acid containing a polymerizable unsaturated group. Examples of the organocarboxylic acid are acrylic acid, methacrylic acid, crotonic acid, monomethyl maleate, monoethyl fumarate and monomethyl itaconate.

Typical examples of the aromatic epoxy resin are glycidyl ethers of bisphenols such as bisphenol A, bisphenol F and bisphenol S, or polymers of glycidyl ethers and bisphenols, phenolic novolak-type epoxy resins, cresol novolak-type epoxy resins, triglycidyl isocyanurate or nuclearly halogenated derivatives of these epoxy resins. Aromatic or aliphatic carboxylic acid-partially modified derivatives of these epoxy resins are also available. Especially preferable are cresol novolak-type epoxy resins.

From the aspect of reactivity, the epoxy equivalent of the aromatic epoxy resin is usually not more than 10,000, more preferably 80 to 5,000, most preferably 150 to 1,000. The molecular weight of said resin is not particularly limited. However, the weight average molecular weight of about 500 or higher is preferable from the aspect of drying to touch of the coated film of the resist, etc., and that of about 5,000 or lower is preferable from the aspect of coating workability. More preferable is 1,000 to 5,000.

Examples of the polymerizable unsaturated group that can be incorporated into the aromatic epoxy resin are acryloyl, methacryloyl, itaconoyl, maleoyl, fumaroyl, crotonoyl, acrylamido, methacrylamido, cinnamoyl, vinyl and allyl. Of these, acryloyl, methacryloyl and acrylamido are preferable.

The aprotic onium salt-containing group is, as represented by formula [I], a group in which the carbon atom in the beta position to the nitrogen, phosphorus or sulfur atom of the aprotic onium salt group is substituted with a secondary hydroxyl group. Such aprotic onium salt group is a quaternary ammonium salt group, a quaternary phosphonium salt group or a tertiary sulfonium salt group. Examples of the aprotic onium salt-containing group are shown below.

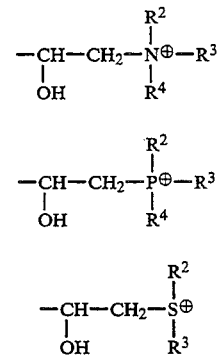

In the above formulas, $R^2$, $R^3$ and $R^4$ are the same or different, and each is an organic group having 1 to 14 carbon atoms. $R^2$ and $R^3$, or $R^2$, $R^3$ and $R^4$ may jointly form, together with the adjacent nitrogen, phosphorus or sulfur atom, a heterocyclic group.

The organic groups having 1 to 14 carbon atoms, which are represented by $R^2$, $R^3$ and $R^4$, are not particularly limited unless substantially interferring with ionization of an ammonium, phosphonium or sulfonium salt group. For example, hydrocarbon groups having 1 to 14 carbon atoms, which may optionally contain one or more hetero atoms such as an oxygen, sulfur and/or nitrogen atom or atoms in the form of a hydroxyl, alkoxy, sulfonyloxy or amino group are generally available.

Such hydrocarbon groups include aliphatic, alicyclic and aromatic hydrocarbon groups such as alkyl, cycloalkyl, cycloalkylalkyl, aryl and aralkyl groups. The alkyl group may be linear or branched and desirably contains not more than 14 carbon atoms, especially not more than 8 carbon atoms. The lower alkyl group is preferable. Examples thereof are methyl, ethyl, n- or iso-propyl, n-, iso-, sec- or tert-butyl, pentyl, heptyl and octyl. The cycloalkyl or cycloalkylalkyl group desirably contains not more than 14 carbon atoms, especially 5 to 8 carbon atoms. Examples thereof are cyclopentyl, cyclohexyl, cyclohexylmethyl and cyclohexylethyl. Examples of the aryl group are phenyl, tolyl and xylyl. A suitable example of the aralkyl is benzyl.

Preferred examples of the hydrocarbon group containing the hetero atom, e.g., an oxygen atom are hydroxyalkyl groups (especially hydroxyl-lower alkyl groups) such as hydroxymethyl, hydroxyethyl, hydroxypropyl, 2,3-dihydroxypropyl, hydroxybutyl, hydroxypentyl, hydroxyheptyl and hydroxyoctyl; alkoxyalkyl groups (especially lower alkoxy-lower alkyl groups) such as methoxymethyl, ethoxymethyl, ethoxyethyl, n-propoxyethyl, iso-propoxymethyl, n-butoxymethyl, iso-butoxyethyl and tert-butoxyethyl; alkoxy hydroxyalkyl group such as 2-hydroxy-3-butoxy propyl; and phenoxy hydroxyalkyl group such as 2-hydroxy 3-phenoxy. A preferred example of the sulfur-containing hydrocarbon group is 2-benzene-sulfonyloxyethyl. A preferred example of the nitrogen-containing hydrocarbon group is 2-(N-acetylamino)ethyl.

Examples of the heterocyclic group —W+ formed jointly by $R^2$ and $R^3$, or $R^2$, $R^3$ and $R^4$, together with the adjacent nitrogen, phosphorus or sulfur atom, are as follows.

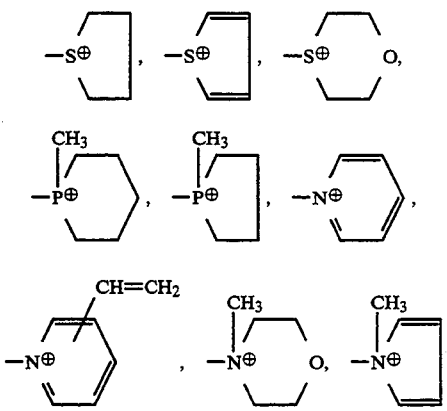

R¹ in formula [I] is a residue of a carboxylic acid forming an anionic moiety of an onium salt. Examples of the hydrocarbon group having 1 to 29 carbon atoms, as represented by formula R¹, which may optionally be substituted with a hydroxyl, alkoxy or ester group or a halogen atom, are aliphatic, alicyclic and aromatic hydrocarbon groups such as alkyl, alkenyl, cycloalkyl, cycloalkylalkyl, aryl and aralkyl groups. Of these, the alkyl and alkenyl groups are preferable. These groups may be linear or branched, and lower groups are especially preferable. Examples thereof are methyl, ethyl, n- or iso-propyl, n-, iso-, sec- or tert-butyl, pentyl, heptyl, octyl, vinyl and 1-methylvinyl. A typical example of the cycloalkyl group is cyclohexyl. Examples of the cycloalkylalkyl group are cyclohexylmethyl and cyclohexylethyl. Examples of the aryl group are phenyl, tolyl and xylyl. A typical example of the aralkyl group is benzyl.

Preferred examples of the hydroxyl group-substituted hydrocarbon group are hydroxyalkyl groups (especially hydroxy-lower alkyl groups), such as hydroxymethyl, hydroxyethyl, hydroxybutyl, hydroxypentyl, hydroxyheptyl and hydroxyoctyl. Preferred examples of the alkoxy group-substituted hydrocarbon group are alkoxyalkyl groups (especially lower alkoxy-lower alkyl groups) such as methoxymethyl, ethoxymethyl, ethoxyethyl, n-propoxyethyl, iso-propoxymethyl, n-butoxymethyl, iso-butoxyethyl and tert-butoxyethyl. Preferred examples of the ester group-substituted hydrocarbon group are lower alkoxycarbonylalkyl, lower alkoxycarbonylalkenyl, and acyloxyalkyl groups such as methoxycarbonylmethyl, propoxycarbonylethyl, ethoxycarbonylpropyl, methoxycarbonylbutyl, methoxycarbonylethylenyl, ethoxycarbonylethylenyl, acetoxymethyl, acetoxyethyl, propionyloxymethyl and propionyloxyethyl acryloyloxyethyl, methacryloyloxyethyl, β-acryloyloxyethyl-oxycarbonyl phenyl. Preferred examples of the halogen atom-substituted hydrocarbon group are chloromethyl, bromomethyl, iodomethyl, dichloromethyl, trichloromethyl, chloroethyl and chlorobutyl.

Preferred examples of the aprotic onium salt-containing group are groups represented by the following formulas.

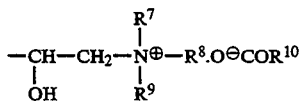

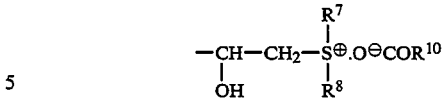

In the above formulas, R⁷, R⁸ and R⁹ are the same or different, and each is an alkyl group having 1 to 8 carbon atoms or a hydroxyalkyl group having 1 to 8 carbon atoms. R¹⁰ is an alkyl group having 1 to 8 carbon atoms or an alkenyl group having 2 to 8 carbon atoms.

More preferred examples of the aprotic onium salt-containing group are those of the above formulas wherein R⁷, R⁸ and R⁹ are the same or different and each is methyl, ethyl, n- or iso-propyl, n-, iso-, sec- or tert-butyl, hydroxymethyl, 2-hydroxyethyl, 2- or 3-hydroxypropyl, 2,3-dihydroxypropyl, or 2-, 3- or 4-hydroxybutyl, and R¹⁰ is methyl, ethyl, n- or iso-propyl, n-, iso-, sec- or tert-butyl, vinyl or 1-methylvinyl.

The content of the polymerizable unsaturated group in the aromatic epoxy resin derivative as component (a) is preferably 0.3 to 10 mole equivalents, more preferably 0.5 to 5 mole equivalents, most preferably per kilogram of the resin solids content of component (a). When it is lower than 0.3 mole equivalent, curing of the resin becomes insufficient. When it is higher than 10 mole equivalents, mechanical properties of the cured product tend to decrease. Neither is thus wanted.

The content of the aprotic onium salt-containing group in the aromatic epoxy resin derivative as component (a) is preferably 0.1 to 3 mole equivalents, more preferably 0.3 to 3 mole equivalents, most preferably 0.5 to 1.5 mole equivalents per kilogram of the resin solids content of component (a). When it is lower than 0.1 mole equivalent, curing tends to become insufficient. When it is higher than 3 mole equivalents, water resistance of the cured product tends to decrease. Neither is thus wanted.

The polymerizable unsaturated group can be introduced into component (a) in a manner known per se. For instance, (1) the addition reaction between the carboxyl group and the epoxy group of the epoxy resin and (2) the addition reaction between the hydroxyl group and the epoxy group of the epoxy resin are available. When the hydroxyl group is present in the epoxy resin, (3) the addition reaction between the isocyanate group and the hydroxyl group is utilized. The introduction of the polymerizable unsaturated group can be conducted with a compound containing a functional group reacting with the functional group of the epoxy resin and a polymerizable unsaturated group.

Examples of the compound containing the polymerizable unsaturated group and the carboxyl group that can be used in the reaction (1) are (meth)acrylic acid, crotonic acid, an itaconic acid monoalkyl ester, a maleic acid monoalkyl ester and a fumaric acid monoalkyl ester. Examples of the compound containing the polymerizable unsaturated group and the hydroxyl group that can be used in the reaction (2) are monohydric alcohols containing the polymerizable unsaturated groups, such as 2-hydroxyethyl (meth)acrylate, 2-hydroxypropyl (meth)acrylate, allyl alcohol, and N-methylol (meth)acrylamide. Examples of the compound containing the polymerizable unsaturated group and the isocyanate group that can be used in the reaction (3) are equimolar additives between the above polymerizable unsaturated group-containing monohydric alcohol and a diisocyanate compound such as tolylenediisocyanate or isophorone diisocyanate, and m-isopropenyl-alpha,alpha-dimethylbenzyl isocyanate.

The onium salt-containing group can be introduced into the aromatic epoxy resin by a method described in (i) or (ii) below.

(i) A method in which the aromatic epoxy resin or its modified resin is reacted with a tertiary amine, a phosphine or a thioether and an organic acid simultaneously in the absence or presence of an inert organic solvent.

Using the tertiary amine as the compound reacting with the resin, this method is schematically shown below.

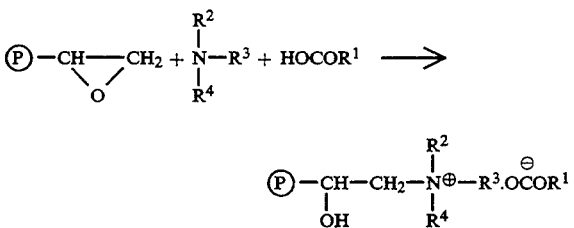

wherein P is a basic moiety of the resin, and $R^1$, $R^2$, $R^3$ and $R^4$ are as defined above.

When the phosphine is used instead of the tertiary amine, N may be replaced with P in the above reaction scheme. When the thioether is used instead of the tertiary amine, N may be replaced with S in the above reaction scheme and $R^4$ may be deleted.

The reaction of the resin, the tertiary amine or the like, and the organic acid is usually performed with heating at about 40° to 80° C. and can be completed in about 1 to 20 hours.

(ii) A method in which a resin containing a 2-halogeno-1-hydroxyethyl group is reacted with a tertiary amine, a phosphine or a thioether in the absence or presence of an organic solvent, a halogen atom is replaced with a hydroxyl group by anion exchange, and the resulting resin is then reacted with an organocarboxylic acid.

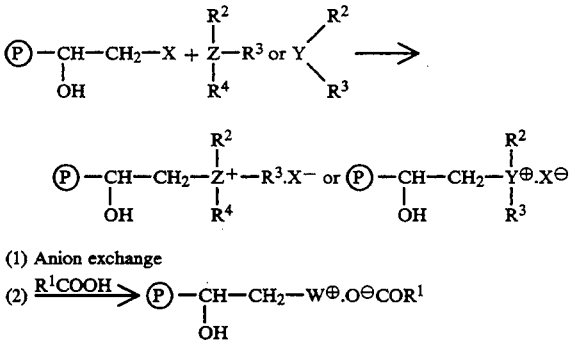

wherein $R^1$, $R^2$, $R^3$, $R^4$, Y, Z, W$\oplus$ and Ⓟ are as defined above, and X denotes a halogen atom.

The aforesaid reaction of the resin with the tertiary amine, the phosphine or the thioether is usually performed under heating at a temperature of about 40° to 100° C. Said reaction may be completed in about 1 to 20 hours.

The substitution of the hydroxyl group for the halogen atom can be conducted, for example, by passing the resin to be treated through a layer of a conventional anion exchange resin which is available, for example, in the form of beads.

The reaction between the thus obtained hydroxyl-substituted resin and the organocarboxylic acid can proceed readily when both the reactants are brought into contact with each other at room temperature.

Examples of the inert organic solvent used in the methods (i) and (ii) are ether alcohol solvents such as ethylene glycol monobutyl ether and ethylene glycol monoethyl ether; ether solvents such as dioxane and ethylene glycol diethyl ether; alcohol solvents such as ethanol, propanol and butanol; and ketone solvents such as methyl ethyl ketone and methyl isobutyl ketone.

Preferred among these solvents are ethylene glycol monobutyl ether, ethylene glycol monoethyl ether, ethylene glycol monomethyl ether, diethylene glycol monobutyl ether, diethylene glycol monoethyl ether, diethylene glycol monomethyl ether, dioxane, tetrahydrofuran, diglyme and glyme.

A wide variety of known organocarboxylic acids capable of forming an anion (—$OCR_1$) are available as the organocarboxylic acid ($HOCR^1$) wherein $R^1$ is a hydrogen atom, or a hydrocarbon group having 1 to 29 carbon atoms which group may optionally be substituted with a hydroxyl, alkoxy or ester group or a halogen atom. Examples thereof are acetic acid, formic acid, trimethylacetic acid, acrylic acid, methacrylic acid, lactic acid, hydroxyacetic acid, crotonic acid, chloroacetic acid, maleic acid monomethyl ester, fumaric acid monoethyl ester and itaconic acid monomethyl ester. Among them, those having a dissociation constant (pKa) of at least $1 \times 10^{-5}$ are preferred. Acetic acid, formic acid, acrylic acid and lactic acid are especially preferred.

Polysiloxane [component (b)]

The polysiloxane used as component (b) in the composition of this invention has a polysiloxane chain represented by the following formula in a molecule,

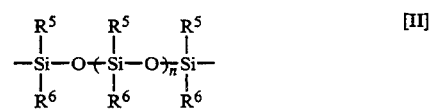

wherein $R^5$, $R^6$ and n are as defined above, and containing 0.01 to 5 mole equivalents, per kilogram of the polysiloxane, of the aprotic onium salt-containing group represented by formula [I].

Examples of "a hydrocarbon group having 1 to 30 carbon atoms which may be substituted with an alkoxy or ester group or a halogen atom", as represented by $R^5$ and $R^6$ in formula [II] are aliphatic, alicyclic and aromatic hydrocarbon groups such as alkyl, alkenyl, cycloalkyl, cycloalkylalkyl, aryl and aralkyl groups. The alkyl and alkenyl groups may be linear or branched having not more than 30 carbon atoms, preferably 1 to 25 carbon atoms, more preferably 1 to 18 carbon atoms. Examples thereof are methyl, ethyl, n- or iso-propyl, n-, iso-, sec- or tert-butyl, hexyl, octyl, decyl, octadecyl, vinyl and 2-methylvinyl. The cycloalkyl and cycloalkylalkyl groups are preferably those having not more than 10 carbon atoms, preferably 5 to 8 carbon atoms. Examples thereof are cyclopentyl, cyclohexyl, cyclohexylmethyl and cyclohexylethyl. Examples of the aryl group are phenyl, tolyl and xylyl. Suitable examples of the aralkyl group are benzyl, p-methylbenzyl and phenetyl groups.

The alkoxy-substituted hydrocarbon group is preferably a lower alkoxy-substituted alkyl group. Examples thereof are methoxymethyl, ethoxymethyl, ethoxyethyl, n-propoxyethyl, isopropoxymethyl, n-butoxymethyl, n-butoxyethyl, iso-butoxy ethyl and tert-butoxyethyl. Preferred examples of the ester group-substituted hydrocarbon group are lower alkoxycarbonylalkyl, lower alkoxycarbonylalkenyl and acyloxyalkyl groups, such as methoxycarbonylmethyl, propoxycarbonylethyl, ethoxycarbonylpropyl, methoxycarbonylbutyl, methoxycarbonylethylenyl, ethoxycarbonylethylenyl, acetoxymethyl, acetoxyethyl, propionyloxymethyl and propionyloxyethyl. Preferred examples of the halogen-substituted hydrocarbon group are chloromethyl, bromomethyl, iodomethyl, dichlorobutyl, trichloromethyl, chloroethyl, chloropropyl, chlorobutyl and 2-(perfluorohexyl)ethyl.

Preferable groups of $R^5$ and $R^6$ in formula [II] are methyl and phenyl.

In formula [II], the repeating number n is an integer of 1 to 200. It is preferably 5 or more from the aspect of impact resistance of the cured film, more preferably 100 or less from the aspects of storage stability and developability of the obtained photopolymerizable composition, and most preferably 10 to 50.

In component (b), the number of the polysiloxane chain represented by formula [II] is not particularly limited. However, it is preferably 1 per molecule of the polysiloxane as component (b).

The aprotic onium salt-containing group in the polysiloxane as component (b) is the same as the aprotic onium salt-containing group of formula [I] described about component (a). Said group can be introduced into the polysiloxane compound or resin in accordance with the method (i) for component (a). That is, the aprotic onium salt-containing group of formula [I] can be introduced into the compound or resin in the same way as in the method (i) except using the compound or resin containing the polysiloxane chain of formula [II] and the epoxy group instead of the epoxy group-containing resin.

In this method, the compound or resin containing the polysiloxane chain of formula [II] and the epoxy group is not particularly limited, and a variety of compounds or resins known per se are available. Its typical example is a diglycidyl polysiloxane represented by formula [III].

pound or resin containing the polysiloxane chain of formula (II) and the 2-halogeno-1-hydroxyethyl group.

The polysiloxane as component (b) can contain 0.01 to 5 mole equivalents, preferably 0.05 to 3 mole equivalents, more preferably 0.1 to 2 mole equivalents, per kilogram of component (b), of the aprotic onium salt-containing group of formula [I]. When the content of the onium salt-containing group is lower than 0.01 mole equivalent per kilogram of component (b), the obtained photopolymerizable composition is easy of phase separation and is decreased in storage stability and developability. When it is higher than 5 mole equivalents, water resistance of the cured product tends to be decreased undesirously.

The polysiloxane as component (b) can contain a polymerizable unsaturated group if required. The polymerizable unsaturated group is the same as the polymerizable unsaturated group indicated about component (a). The polymerizable unsaturated group can be introduced into component (b) in the same way as in the above methods (1), (2) and (3) for introducing the polymerizable unsaturated group into component (a) except that the compound or resin containing the polysiloxane chain of formula [II] and the epoxy group is used instead of the aromatic epoxy resin in (1) and (2) and the compound or resin containing the polysiloxane chain of formula [II] and the hydroxyl group and optionally the epoxy group is used instead of the hydroxyl group-containing aromatic epoxy resin in (3).

The content of the polymerizable unsaturated group in component (b) is not strictly limited. However, it is usually not more than 5 mole equivalents, more preferably 0.01 to 3 mole equivalents, most preferably 0.1 to 2 mole equivalents, per kilogram of the polysiloxane as component (b). When the polymerizable unsaturated group is present in component (b), component (b) also contributes to polymerization by the reaction of the polymerizable unsaturated group in the curing, improving sensitivity to light.

In order to obtain component (a), either the reaction of introducing the polymerizable unsaturated group or the reaction of introducing the aprotic onium salt-containing group may be conducted first. From the standpoint of ease of controlling the reaction, it is advisable that they are simultaneously conducted or the reaction of introducing the polymerizable unsaturated group is conducted first. When component (b) contains a poly-

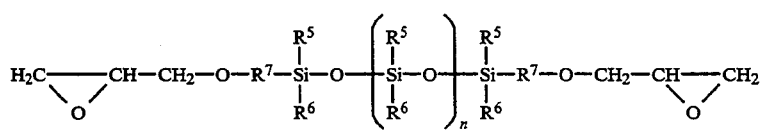

[III]

wherein $R^5$, $R^6$ and n are as defined above, and $R^7$ denotes an alkylene group having 1 to 10 carbon atoms, a phenylene group or a substituted phenylene group.

Examples of the alkylene group represented by $R^7$ are lower alkylene groups such as ethylene, 1,3-propylene and 1,4-butylene. Examples of the substituted phenylene are lower alkyl-substituted phenylenes such as tolylene and xylylene.

Alternatively, the aprotic onium salt-containing group can be introduced into the polysiloxane compound or resin in the same way as in the method (ii) described about component (a) except using the commerizable unsaturated group, the reaction order can be the same as in case of component (a). Components (a) and (b) may be formed separately, or the aromatic epoxy resins and the compounds or resins containing the polysiloxane chains of formula [II] and the epoxy groups, which are starting materials of components (a) and (b), may be mixed and subjected to the polymerizable unsaturated group introduction reaction and the aprotic onium salt-containing group introduction reaction to obtain the mixture of components (a) and (b).

In the composition of this invention, the mixing ratio of the aromatic epoxy resin derivative as component (a) and the polysiloxane as component (b) is not limited in particular, and can vary over a wide range depending on usage, etc. of the composition of this invention. From the standpoint of performance of the coated film, the amount of compound (b) is 0.1 to 100 parts by weight, preferably 1 to 50 parts by weight, most preferably 5 to 20 parts by weight per 100 parts by weight of component (a).

Photopolymerization initiator [component (c)]

In the composition of this invention, a variety of photopolymerization initiators known per se are available as component (c). Examples thereof are benzoin, benzoin methyl ether, benzoin ethyl ether, benzyl, diphenyl disulfide, tetramethylthiuram monosulfide, eosin, thionine, diacetyl, Michler's ketonef anthraquinone, chloroanthraquinone, methylanthraquinone, alpha-hydroxyisobutylphenone, p-isopropylalphahydroxyisobutylphenone, alpha,alpha'-dichloro-4-phenoxyacetophenone, 1-hydroxy-1-cyclohexylacetophenone, 2,2-dimethoxy-2-phenylacetophenone, methylbenzoyl formate, 2-methyl-1-[4-(methylthio)phenyl]-2-morpholinopropanone, thioxantone, benzophenone, titanocene, and 2-benzyl-2-dimethylamino-1-(4-morpholinophenyl)-butanone.

The amount of the photopolymerization initiator is preferably 0.01 to 20 parts by weight, more preferably 0.1 to 10 parts by weight, most preferably 0.2 to 8 parts by weight per 100 parts by weight (solids content) in total of components (a) and (b).

Photopolymerizable composition

The composition of this invention may be composed substantially of three components (a), (b) and (c) alone. Usually, however, from the aspect of coatability, said composition can be formulated into an organic solvent solution or into an aqueous solution or an aqueous dispersion by using a water-miscible solvent as a solvent in the synthesis of the resin solution and mixing the obtained resin solution with water.

The solvent is not particularly limited if it can dissolve or disperse components (a), (b) and (c) in this invention. Examples thereof are esters such as ethyl acetate and butyl acetate; glycol or glycol ethers such as ethylene glycol, diethylene glycol and propylene glycol; aromatic hydrocarbons such as toluene and xylene; alcohols such as methanol, ethanol and butanol; ketones such as methyl ethyl ketone and methyl isobutyl ketone; and water. They may be used either singly or in combination. The amount of solvent may be properly adjusted depending on the coating method of the composition, etc.

Moreover, the composition of this invention can contain a heat-curing catalyst. Examples of the catalyst include alkali metal hydroxides such as sodium hydroxide and lithium hydroxide; alkaline earth metal hydroxides such as calcium hydroxide and magnesium hydroxide; and hydroxides, organic acid salts and alkoxides of metals selected from nickel, copper, molybdenum, lead, iron, chromium, manganese, tin and cobalt. The amount of the curing catalyst is not more than 10 parts by weight, preferably 0.1 to 5 parts by weight per 100 parts by weight (solids content) in total of components (a) and (b).

The composition of this invention may further contain additives such as a color pigment, an extender pigment, a rust-proofing pigment, a dye, a thermoplastic polymer, a polymerizable vinyl monomer or oligomer, a leveling agent, a defoamer, and an antisagging agent. The color pigment, the extender pigment, the rust-proofing pigment and the dye can be those ordinarily used in the field of ink and paint. The amounts of these additives are not more than 50% by weight, preferably not more than 30% by weight based on the solids content of the composition in this invention.

The polymerizable vinyl monomer or oligomer may be a monofunctional one containing 1 polymerizable unsaturated group or a polyfunctional one containing 2 or more polymerizable unsaturated groups. Examples of the monofunctional vinyl monomer or oligomer include (meth)acrylic acid alkyl esters such as methyl (meth)acrylate, ethyl (meth)acrylate, propyl (meth)acrylate, butyl (meth)acrylate and 2-ethylhexyl (meth)acrylate; (meth)acrylic acid hydroxyalkyl esters such as 2-hydroxylethyl (meth)acrylate; (meth)acrylic acid; and styrene. Examples of the polyfunctional vinyl monomer or oligomer are trimethylolpropane tri(meth)acrylate, pentaerythritol di(meth)acrylate, norbornene di(meth)acrylate, and tricyclodecanedimethanol di(meth)acrylate. The amount of the polymerizable vinyl monomer or oligomer or the thermoplastic polymer is preferably not more than 30% by weight based on the solids content of the composition of this invention.

Formation of a coated film

The thus obtained photopolymerizable composition of this invention can be coated on a substrate to a dry thickness of usually 1 to 100 micrometers, preferably 5 to 70 micrometers by a common method such as spray coating, brush coating, roll coating, dip coating, silk screen printing, or the like. The uncured coated film can be cured by irradiating it with actinic radiation such as ultraviolet light (including light having a wavelength of 100 to 600 nm) in a dose of usually 10 mJ/cm$^2$ to 500 mJ/cm$^2$, preferably 50 mJ/cm$^2$ to 200 mJ/cm$^2$.

A light source for irradiation can be one used so far for curing with actinic radiation such as ultraviolet light, etc. Examples of the light source are an ultrahigh pressure mercury lamp, a high pressure mercury lamp, a xenone lamp, and a metal halide lamp. The photocured coated film may further be subjected to heat treatment. For example, the heat treatment at about 100° to about 200° C. especially about 120° to about 180° C. for about 10 to about 60 minutes allows heat polymerization of unsaturated groups left in the resin or addition reaction between unsaturated groups and hydroxyl groups, making it possible to form a coated film having high crosslink density and improve heat resistance and chemical resistance of the coated film because the hydrophilic onium salt group of the coated film is heat decomposed and rendered hydrophobic.

In case of forming a protective film having a pattern on a substrate, e.g., forming a resist coated film having a pattern on a circuit board, formation of the coated film can be conducted, for example, by drying the uncured coated film formed on the substrate to touch at a temperature of 100° C. or below, imagewise irradiating the coated film with actinic radiation as above via a film with a desired pattern drawn, then developing the coated film with water or a dilute aqueous solution containing not more than 3% by weight of an inorganic or organic acid, and eluting and removing the unexposed portion. In order to improve performance of the coated film, it is advisable to conduct the same heat treatment as above. A resist film excellent in adhesion to a substrate, heat resistance, chemical resistance, impact resistance and solder plating property can be obtained by the process of this invention.

The composition of this invention can provide the coated film excellent in adhesion to a substrate, heat resistance, chemical resistance and impact resistance. When forming a resist film having a pattern, the uncured coated film can be developed with harmless water or dilute acid aqueous solution, which can therefore solve safety or sanitation problems. Moreover, the resist film obtained by the process of this invention shows the above performance of the coated film as well as excellent performance in solder plating property as a solder resist.

EXAMPLES

This invention will be illustrated by the following Examples more specifically. In said Examples "parts" and "%" are all by weight.

Production of components (a) and (b)

PRODUCTION EXAMPLE 1

The following components were charged in a flask filled with 405 parts of ethylene glycol monobutyl ether, dissolved, and heated at 110° C. for 5 hours to obtain an epoxy ester resin solution having a resin acid value of 0.5.

|  | parts |
| --- | --- |
| EOCN-104S (*1) | 660 |
| Sila Plane FM5511 (*2) | 195 |
| Acrylic acid | 151.2 |
| Tetraethylammonium bromide | 1.2 |
| Hydroquinone | 1.2 |

After the solution was cooled to about 50° C., 140.4 parts of N,N-diethylethanolamine and 72 parts of acetic acid were added, and the reaction was conducted at 70° C. for 10 hours to obtain a resin solution A-1 having a solids content of about 75%.

PRODUCTION EXAMPLE 2

The following components were charged in a flask filled with 450 parts of ethylene glycol monobutyl ether dissolved, and then heated at 110° C. for 5 hours to obtain an epoxy ester resin solution having a resin acid value of 0.5.

|  | parts |
| --- | --- |
| EBPS-300 (*3) | 789 |
| FM5511 | 195 |
| Acrylic acid | 151.2 |
| Hydroquinone | 1.2 |
| Tetrabutylammonium bromide | 1.2 |

After the solution was cooled to about 50° C., 140.4 parts of N,N-diethylethanolamine and 72 parts of acetic acid were added, and the reaction was conducted at 70° C. for 10 hours to obtain a resin solution A-2 having a solids content of about 75%.

PRODUCTION EXAMPLE 3

A flask filled with 468.3 parts of ethylene glycol monobutyl ether was charged with 840 parts of BREN-S (*4) and 243 parts of Sila Plane FM-5521 (*5). After they were dissolved, the following components were added to the solution.

|  | parts |
| --- | --- |
| Acrylic acid | 222.6 |
| 1,4-Thioxane | 72 |
| Ethyl sulfide | 27 |
| Hydroquinone | 0.6 |

The reaction was conducted at 70° C. for 10 hours to obtain a resin solution A-3 having a solids content of about 75%.

PRODUCTION EXAMPLE 4

A flask filled with 462.8 parts of ethylene glycol monobutyl ether was charged with 960 parts of Epikote 1004 (*6) and 270 parts of FM-5521. After they were dissolved, the following components were added to the solution.

|  | Parts |
| --- | --- |
| Acrylic acid | 79.2 |
| N,N-diethylethanolamine | 58.6 |
| Tributylphosphine | 20.2 |
| Hydroquinone | 0.5 |

The reaction was conducted at 50° C. for 10 hours to obtain a resin solution A-4 having a solids content of about 75%.

PRODUCTION EXAMPLE 5

Epikote 1004 (960 parts) was charged into a flask filled with 462.8 parts of ethylene glycol monobutyl ether, and dissolved. The following components were then added, and the reaction was run at 70° C. for 10 hours to obtain a resin solution A-5 having a solids content of about 70%.

|  | parts |
| --- | --- |
| Acrylic acid | 72.0 |
| N,N-diethylethanolamine | 58.6 |
| Hydroquinone | 0.4 |

Another flask was charged with the following components, and the reaction was run at 70° C. for 10 hours to obtain a resin A-6 having a solids content of 100%.

|  | parts |
| --- | --- |
| FM-5521 | 270 |
| Acrylic acid | 7.2 |
| Tributylphosphine | 20.2 |
| Hydroquinone | 0.1 |

To the resin A-6 were added 1,553.8 parts of the resin solution A-5, and the mixture was vigorously stirred at room temperature to obtain a resin solution A-7 having a solids content of about 75%.

PRODUCTION EXAMPLE 6

A flask was charged with the following components, and the reaction was run at 70° C. for 10 hours to obtain a resin A-8 having a solids content of 100%.

|  | parts |
| --- | --- |
| FM-5521 | 270 |
| Acetic acid | 6 |
| Tributylphosphine | 20.2 |

Subsequently, 1,553.8 parts of the resin solution A-5 obtained in Production Example 5 were added to the resin A-8, and the mixture was vigorously stirred at room temperature to afford a resin solution A-9 having a solids content of about 75%.

COMPARATIVE PRODUCTION EXAMPLE 1

Production Example 1 was repeated except using 726 parts of EOCN-104S instead of 660 parts of EOCN-104S and 195 parts of FM5511. There resulted a resin solution B-1 having a solids content of 72.8%.

COMPARATIVE PRODUCTION EXAMPLE 2

Production Example 2 was repeated except using 868 parts of EBPS-300 instead of 789 parts of EBPS-300 and 195 parts of FM5511. There resulted a resin solution B-2 having a solids content of 73.3%.

COMPARATIVE PRODUCTION EXAMPLE 3

Production Example 3 was repeated except using 865 parts of BREN-S instead of 840 parts of BREN-S and 243 parts of FM-5521. There resulted a resin solution B-3 having a solids content of 71.7%.

COMPARATIVE PRODUCTION EXAMPLE 4

Production Example 4 was repeated except using 1,056 parts of Epikote 1004 instead of 960 parts of Epikote 1004 and 270 parts of FM-5521. There resulted a resin solution B-4 having a solids content of 72.4%.

COMPARATIVE PRODUCTION EXAMPLE 5

The resin solution A-5 (1,553.8 parts) in Production Example 5 and FM-5521 (270 parts) were mixed, and the mixture was vigorously stirred at room temperature to obtain a resin solution B-5 having a solids content of 74.6%.

The concentration (mole/kg) of the polymerizable unsaturated group and the concentration (mole/kg) of the aprotic onium salt-containing group represented by formula [I] in the solids content each of the epoxy resin derivative as component (a) and the polysiloxane as component (b) in the resin solutions obtained in Production Examples 1 to 5 and Comparative Production Examples 1 to 5 are shown in Table 1 below.

TABLE 1

| | Resin Solution | Component (a) | | Component (b) | |
|---|---|---|---|---|---|
| | | Polymerizable unsaturated group (mole/kg) | Oniumsalt-containing group (mole/kg) | Polymerizable unsaturated group (mole/kg) | Oniumsalt-containing group (mole/kg) |
| Production Example | | | | | |
| 1 | A-1 | 1.94 | 1.09 | 0.79 | 0.52 |
| 2 | A-2 | 1.72 | 0.97 | 0.79 | 0.52 |
| 3 | A-3 | 2.61 | 0.83 | 0.35 | 0.15 |
| 4 | A-4 | 0.91 | 0.49 | 0.35 | 0.21 |
| 5 | A-7 | 0.92 | 0.46 | 0.34 | 0.34 |
| 6 | A-9 | 0.92 | 0.46 | 0 | 0.34 |
| Comparative Production Example | | | | | |
| 1 | B-1 | 1.92 | 1.10 | — | — |
| 2 | B-2 | 1.70 | 0.97 | — | — |
| 3 | B-3 | 2.60 | 0.83 | — | — |
| 4 | B-4 | 0.91 | 0.49 | — | — |
| 5 | B-5 | 0.92 | 0.46 | 0 | 0 |

EXAMPLE 1

The following components were kneaded to obtain a photopolymerizable composition of this invention.

| | parts |
|---|---|
| Resin solution A-1 | 133.3 (solids content of 100) |
| Photopolymerization initiator (Darocur 1173 (*7)) | 8 |
| Phthalocyanine green | 0.5 |
| Finely divided talc | 50 |
| Lead octanoate | 0.1 |
| Modaflow (*8) | 0.5 |

(*7) Darocur 1173: a trademark for a photopolymerization initiator of Merck
(*8) Modaflow: a trademark for a surface active agent of Monsanto Co., Ltd.

EXAMPLES 2 to 6 and COMPARATIVE EXAMPLES 1 to 5

Example 1 was followed except that each of the resin solutions shown in Table 2 was used in an amount of 100 parts (solids content) instead of the resin solution A-1. There was obtained a photopolymerizable composition.

The thus obtained composition was used as an ink, and coated by a silk screen method to a dry film thickness of 20 to 30 micrometers on a copper through-hole printed circuit board etched previously, and predried at 80° C. for 10 minutes. A sample for evaluating developability was formed by closely adhering a negative mask to the predried coated film, and irradiating it with 800 mJ/cm$^2$ of light with an ultrahigh pressure mercury lamp. Samples for evaluating properties other than developability were prepared by directly irradiating the whole surface of the predried coated film with 800 mJ/cm$^2$ of light with an ultrahigh pressure mercury lamp, and then conducting baking at 150° C. for 25 minutes.

The resulting samples were tested according to the following methods. The results are shown in Table 2.

Test Methods

Developability: Tap water was used as a developer and sprayed onto an exposed resist film at 25° C. and a spray pressure of 2 kg/cm$^2$ for 60 seconds.

◯: Well developable even within the through holes.
x: Almost undevelopable.

Impact resistance: Tested according to JIS K5400 8.3.2 (1990). Using a shock mold having a top radius of 6.3 mm, a weight of 500 g was dropped from a height of 30 cm, and crack and peeling of the resist were estimated with an unaided eye.

◯: Crack and peeling do not occur at all.
Δ: Crack partially occurs in and around the impact position.
x: Peeling occurs in and around the impact position.

Solder plating property

A sample was treated with an aqueous flux CF330 VH (a product of Tamura Kaken K. K.), dried with hot air at 80° C. for 5 minutes, and dipped in a solder bath of 260° C. for 10 seconds. The above procedure (flux treatment-drying-dipping) was made 1 cycle and repeated five times (5 cycles). Solder plating property was evaluated by adhesion. Said adhesion was measured according to JIS K5400 8.5.2 (1990). Namely, 100 crosscuts were applied to the test piece at intervals of 1 mm, and a sticky cellophane tape was adhered to this portion and instantaneously peeled off. Adhesion was evaluated by the number of unpeeled crosscuts. That is:

⊚: The number of unpeeled crosscuts is 100.
◯: The number of unpeeled crosscuts is 99 to 95.
Δ: The number of unpeeled crosscuts is 94 to 50.
x: The number of unpeeled crosscuts is less than 50.
Storage stability The photopolymerizable composition (100 cc) obtained in each of Examples and Comparative Examples was put in a glass bottle, and the glass bottle was closed and left to stand in a dark place of 30° C. The time that lapsed until thickening or gelation notably occurred or the time that lapsed until heavy phase separation occurred was measured. The test piece with no abnormality even after 6 months is indicated at ">6 months".

Samples for evaluating other properties than developability, which were obtained from the photopolymerizable compositions in Examples and Comparative Examples, were subjected to an adhesion test [according to JIS K5400 8.5.2 (1990)] and a chemical resistance test [a dipping test at 20° C. for 60 minutes with respect to chemicals, i.e., 1,1,1-trichloroethane, trichloroethylene isopropyl alcohol, methylene chloride, a 10% hydrochloric acid aqueous solution, a 10% sulfuric acid aqueous solution and a 5% sodium hydroxide aqueous solution]. Consequently, no abnormality was found in any of the samples, and they were good in adhesion and chemical resistance.

(b) a polysiloxane having a polysiloxane chain of the formula

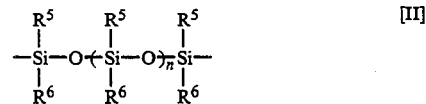

wherein $R^5$ and $R^6$ are the same or different and each denotes a hydrocarbon group having 1 to 30 carbon atoms which may be substituted with an alkoxy or ester group or a halogen atom, and n is an integer of 1 to 200, and containing 0.01 to 5 mole equivalents, per kilogram of the polysiloxane, of the aprotic onium salt-containing group of formula [I], and (c) a photopolymerization initiator.

2. The composition of claim 1 wherein the aromatic epoxy resin derivative (a) is based on an epoxy resin selected from the group consisting of bisphenol glycidyl ethers, polymers of bisphenol glycidyl ethers and bisphenols, phenol novolak-type epoxy resins, cresol novolak-type epoxy resins, triglycidyl isocyanurate, and nuclearly halogenated derivatives or aromatic or aliphatic carboxylic acid-partially modified derivatives of these epoxy resins.

TABLE 2

| | Example | | | | | | Comparative Example | | | | |
|---|---|---|---|---|---|---|---|---|---|---|---|
| | 1 | 2 | 3 | 4 | 5 | 6 | 1 | 2 | 3 | 4 | 5 |
| Resin solution | A-1 | A-2 | A-3 | A-4 | A-7 | A-9 | B-1 | B-2 | B-3 | B-4 | B-5 |
| Developability | ○ | ○ | ○ | ○ | ○ | ○ | ○ | ○ | ○ | ○ | x |
| Impact resistance | ○ | ○ | ○ | ○ | ○ | ○ | x | x | x | x | x |
| Solder plating property | ⊚ | ⊚ | ⊚ | ⊚ | ⊚ | ⊚ | ○ | ○ | ○ | Δ | x |
| Storage stability | >6 months | >6 months | >6 months | >6 months | >6 months | >6 months | >6 months | >6 months | >6 months | >6 months | Phase separation in 2 days |

What we claim is:

1. A photopolymerizable composition comprising:
(a) an aromatic epoxy resin derivative containing, per kilogram of the resin derivative, 0.3 to 1 mole equivalents of a polymerizable unsaturated group, and 0.1 to 3 mole equivalents of an aprotic onium salt-containing group of the formula

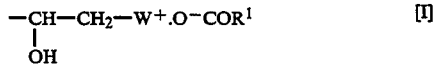

wherein $R^1$ denotes a hydrogen atom or a hydrocarbon group having 1 to 29 carbon atoms which may be substituted with a hydroxyl, alkoxy or ester group or a halogen atom; and

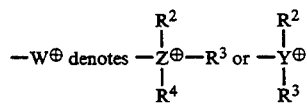

in which Z denotes a nitrogen or phosphorus atom, Y denotes a sulfur atom, $R^2$, $R^3$ and $R^4$ are the same or different and each denotes an organic group having 1 to 14 carbon atoms, or $R^2$ and $R^3$ or $R^2$, $R^3$ and $R^4$ may jointly form a heterocyclic group when taken together with the adjacent nitrogen, phosphorus or sulfur atom, 3. The composition of claim 2 wherein the epoxy resin has an epoxy equivalent of 80 to 5,000.

4. The composition of claim 2 wherein the epoxy resin has a weight average molecular weight of about 500 to about 5,000.

5. The composition of claim 1 wherein said polymerizable unsaturated group is selected from the group consisting of acryloyl, methacryloyl, itaconoyl, maleoyl, fumaroyl, crotonoyl, acrylamido, methacrylamido, cynnamoyl, vinyl and allyl groups.

6. The composition of claim 5 wherein said polymerizable unsaturated group is acryloyl, methacryloyl or acrylamido.

7. The composition of claim 1 wherein said aromatic epoxy resin derivative (a) contains 0.5 to 5 mole equivalents, per kilogram of the resin derivative, of the polymerizable unsaturated group.

8. The composition of claim 1 wherein said aprotic onium salt-containing group is represented by the formula

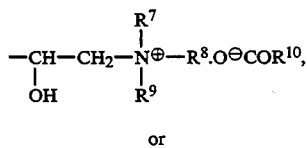

or

-continued

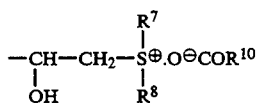

wherein $R^7$, $R^8$ and $R^9$ are the same or different and each denotes an alkyl group having 1 to 8 carbon atoms or a hydroxyalkyl group having 1 to 8 carbon atoms, and $R^{10}$ denotes an alkyl group having 1 to 8 carbon atoms or an alkenyl group having 1 to 8 carbon atoms.

9. The composition of claim 8 wherein $R^7$, $R^8$ and $R^9$ are the same or different and each is methyl, ethyl, n- or iso-propyl, n-, iso-, sec- or tert-butyl, hydroxymethyl, 2-hydroxyethyl, 2- or 3-hydroxypropyl, 2,3-dihydroxypropyl, or 2-, 3- or 4-hydroxybutyl, and $R^{10}$ is methyl, ethyl, n- or iso-propyl, n-, iso-, sec- or tert-butyl, vinyl or 1-methylvinyl.

10. The composition of claim 1 wherein said aromatic epoxy resin derivative (a) contains 0.3 to 2 mole equivalents, per kilogram of the resin derivative, of the aprotic onium salt-containing group.

11. The composition of claim 1 wherein $R^5$ and $R^6$ in formula [II] are each methyl or phenyl.

12. The composition of claim 1 wherein n in formula is an integer of 5 to 100.

13. The composition of claim 1 wherein said polysiloxane (b) contains one polysiloxane chain of formula in the molecule.

14. The composition of claim 1 wherein said polysiloxane (b) contains 0.05 to 3 mole equivalents, per kilogram of the polysiloxane, of the aprotic onium salt-containing group.

15. The composition of claim 1 wherein said polysiloxane (b) contains at least one polymerizable unsaturated group in the molecule.

16. The composition of claim 1 wherein the amount of said polysiloxane (b) is 0.1 to 100 parts by weight per 100 parts by weight of the aromatic epoxy resin derivative (a).

17. The composition of claim 1 wherein the amount of said polysiloxane (b) is 1 to 50 parts by weight per 100 parts by weight of the aromatic epoxy resin derivative (a).

18. The composition of claim 1 wherein the amount of said photopolymerization initiator (c) is 0.01 to 20 parts by weight per 100 parts by weight in total of the aromatic epoxy resin derivative (a) and polysiloxane (b).

19. The composition of claim 18 wherein the amount of said photopolymerization initiator (c) is 0.1 to 10 parts by weight per 100 parts by weight in total of the aromatic epoxy resin derivative (a) and the polysiloxane (b).

* * * * *